(12) United States Patent
Han et al.

(10) Patent No.: US 8,184,448 B2
(45) Date of Patent: May 22, 2012

(54) BARE CHIP EMBEDDED PCB

(75) Inventors: Kyung-Jin Han, Seoul (KR);
Hyung-Tae Kim, Suwon-si (KR);
Moon-Il Kim, Daejeon (KR); Jae-Kul Lee, Seoul (KR); Doo-Hwan Lee, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 899 days.

(21) Appl. No.: 11/703,814

(22) Filed: Feb. 8, 2007

(65) Prior Publication Data
US 2007/0181988 A1 Aug. 9, 2007

(30) Foreign Application Priority Data
Feb. 9, 2006 (KR) .................. 10-2006-0012512

(51) Int. Cl.
*H05K 1/16* (2006.01)

(52) U.S. Cl. ........ 361/765; 361/763; 361/764; 361/782; 361/784

(58) Field of Classification Search .......... 361/760–766, 361/782–784, 793–795; 174/259–264
See application file for complete search history.

(56) References Cited

U.S. PATENT DOCUMENTS

| | | | |
|---|---|---|---|
| 4,293,637 A | 10/1981 | Hatada et al. | |
| 4,635,356 A | 1/1987 | Ohuchi et al. | |
| 5,048,179 A * | 9/1991 | Shindo et al. | 29/840 |
| 5,563,449 A * | 10/1996 | Dion et al. | 257/764 |
| 5,875,100 A * | 2/1999 | Yamashita | 361/764 |
| 6,162,652 A * | 12/2000 | Dass et al. | 438/18 |
| 6,724,638 B1 * | 4/2004 | Inagaki et al. | 361/763 |
| 6,770,965 B2 | 8/2004 | Takeuchi et al. | |
| 7,071,024 B2 * | 7/2006 | Towle et al. | 438/106 |
| 7,183,658 B2 * | 2/2007 | Towle et al. | 257/784 |
| 7,312,405 B2 * | 12/2007 | Hsu | 174/262 |
| 7,435,910 B2 * | 10/2008 | Sakamoto et al. | 174/260 |
| 2001/0010627 A1 | 8/2001 | Akagawa | |
| 2002/0158334 A1 * | 10/2002 | Vu et al. | 257/723 |
| 2004/0168825 A1 | 9/2004 | Sakamoto et al. | |

FOREIGN PATENT DOCUMENTS

| | | |
|---|---|---|
| JP | 2000-124248 | 4/2000 |
| JP | 2001-345559 | 12/2001 |
| JP | 2003-147049 | 5/2003 |
| JP | 2004-55967 | 2/2004 |
| WO | 2005/125298 | 12/2005 |

OTHER PUBLICATIONS

Notice of Preliminary Rejection, dated Dec. 14, 2006, Korean Intellectual Property Office (KIPO).
Chinese Office Action issued on Oct. 10, 2008 in corresponding Chinese Patent Application No. 200710007584.5.
Japanese Office Action issued Feb. 2, 2010 in corresponding Japanese Patent Application 2007-029627.

(Continued)

*Primary Examiner* — Tuan T Dinh (57) ABSTRACT

A PCB having an embedded bare chip includes an insulated substrate having a penetration hole formed therein; a filler filling up an inside of the penetration hole; a bare chip embedded in the filler such that electrode pads formed on one side thereof are exposed at the surface of the filler; and an electrode bump attached to a surface of the electrode pads and protruded to be exposed to the outside.

4 Claims, 8 Drawing Sheets

OTHER PUBLICATIONS

Jillek W. et al., "Hadbuch der Leiterplattentechnik-Band 4", Eugen G. Leuze Verlag, Bad Saulgau 2003, pp. 380-381.
German Office Action dated Mar. 4, 2010 and issued in corresponding German Patent Application 10 2007 005 920.7-34.
Japanese Office Action dated May 25, 2010 and issued in corresponding Japanese Patent Application 2007-029627.
Finnish Office Action issued Mar. 28, 2011 in corresponding Finnish Patent Application 20075088.

* cited by examiner

BARE CHIP EMBEDDED PCB

CROSS-REFERENCE TO RELATED APPLICATIONS

This application claims the benefit of Korean Patent Application No. 10-2006-0012512 filed with the Korean Intellectual Property Office on Feb. 9, 2006, the disclosure of which is incorporated herein by reference in its entirety.

BACKGROUND

1. Technical Field

The present invention relates to a printed circuit board, and in particular, to a printed circuit board having embedded electronic components and manufacturing method thereof.

2. Description of the Related Art

Recently, the size of electro components is becoming smaller, and the demand is increasing for high-end products that provide various functions in single packages. In order to meet these desires of consumers, components which had hitherto been attached on the surface of a substrate are being embedded inside the substrate. However, such embedding techniques bring about the problem of cost increase, and this cost increase has to be compensated with improvements in electrical characteristics and miniaturization. Thus, an inexpensive embedding technique is required in order to stimulate the commercialization of the built-in board.

Until now, most embedding techniques have been applied to wafer level packages, in which bumps made of gold or copper are distributed in an area array type over the entire surface of the chip, because it is difficult to perform laser processing after having the chip embedded in the aluminum pads of a thin (about 1 um thickness) thickness generally used as the chip finish metal. However, as to the area array type, the overall package price is raised, due to the expenses in rewiring and forming metal bumps.

Figure 1:
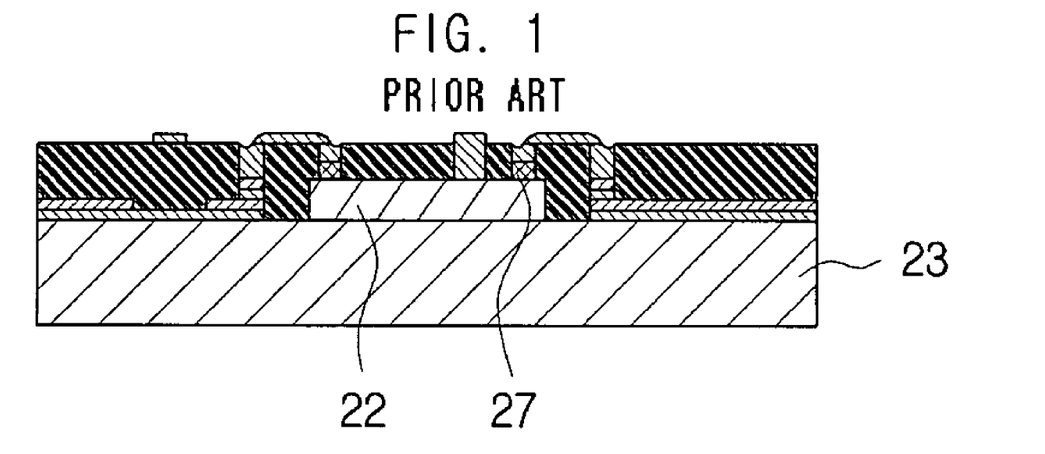
FIG. 1 is a cross-sectional view of a PCB having an embedded chip according to prior art.

FIG. 1 is a cross-sectional view of a PCB having an embedded chip according to prior art, where a chip 22 having electrode bumps 27 is embedded inside the core board 23.

Conventionally, an operation of forming the electrode bumps on the pads of the chip was performed in order to embed the chip as shown the FIG. 1, which was generally performed by foreign companies. Therefore, the bumping process incurred additional cost and time.

SUMMARY

An aspect of the present invention is to provide a PCB having an embedded bare chip and a manufacturing method thereof, in which the bumping process on the electrode pads is omitted, and the bare chip is embedded as it is.

One aspect of the present invention provides a method of manufacturing a PCB including embedding a bare chip in a board such that electrode pads of the bare chip are exposed, and forming electrode bumps on the electrode pads.

It may be preferable that the forming of electrode bumps include forming an electro circuit. It may also be preferable that the electro circuit and the electrode bumps be connected electronically.

Another aspect of the present invention provides a method of manufacturing a PCB, including attaching a tape to one side of an insulated substrate having a penetration hole formed therein, and attaching the bare chip onto the tape inside the penetration hole such that electrode pads of the bare chip face the tape, filling up the penetration hole with a filler and removing the tape, laminating a metal layer onto a surface of the filler and the insulated substrate from which the tape is removed, and forming electrode bumps by removing portions of the metal layer.

The method of manufacturing the PCB may further include cleaning one side of the filler and the insulated substrate, between the filling up of the penetration hole and the laminating.

The laminating, in the method of manufacturing the PCB, may include laminating the diffusion stopping layer onto one side of the insulated substrate, and laminating a thick film onto an upper side of the diffusion stopping layer.

The forming of electrode bumps may further include removing portions of the metal layer and forming an electro circuit on one side of the insulated substrate.

Still another aspect of the present invention provides a PCB (printed circuit board) having an embedded bare chip, which includes an insulated substrate having a penetration hole formed therein, a filler filling up an inside of the penetration hole, a bare chip embedded in the filler such that electrode pads formed on one side thereof are exposed at the surface of the filler, and an electrode bump attached to a surface of the electrode pads.

It may be preferable that the electrode bump include a diffusion stopping layer positioned at the surface of the electrode pad, and a thick film laminated on the surface of the diffusion stopping layer. Also, the diffusion stopping layer may be made of titanium.

DETAILED DESCRIPTION

Embodiments of the bare chip embedded PCB according to the invention will be described below in more detail with reference to the accompanying drawings. In the description with reference to the accompanying drawings, those components are rendered the same reference number that are the same or are in correspondence regardless of the Fig. number, and redundant explanations are omitted.

Figure 2A:
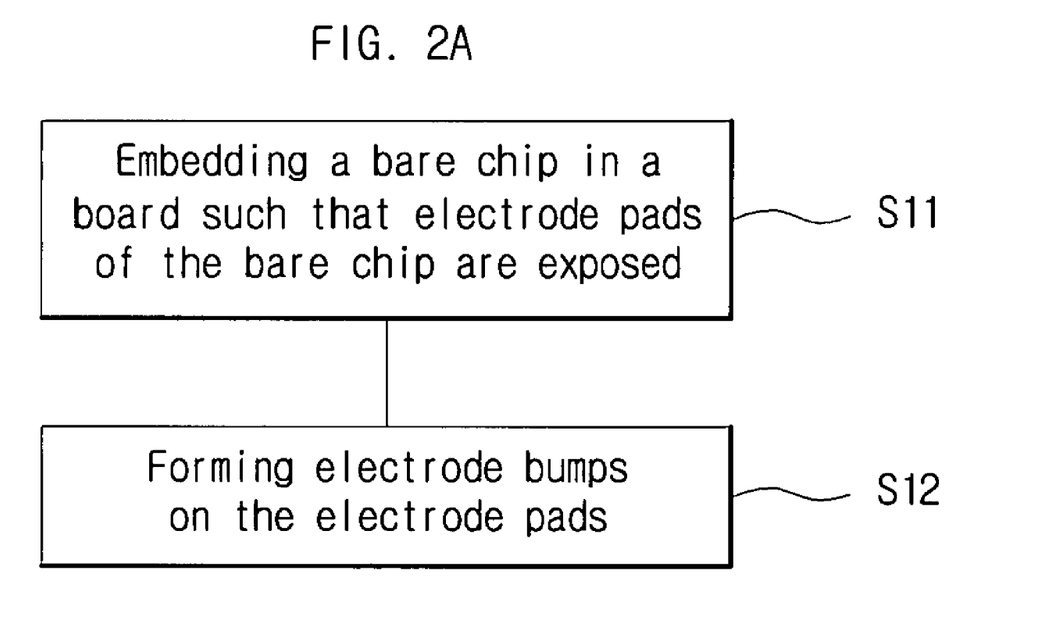
FIG. 2a is a flowchart of a method of manufacturing a PCB having an embedded bare chip according to a first disclosed embodiment of the invention.
Figure 2B:
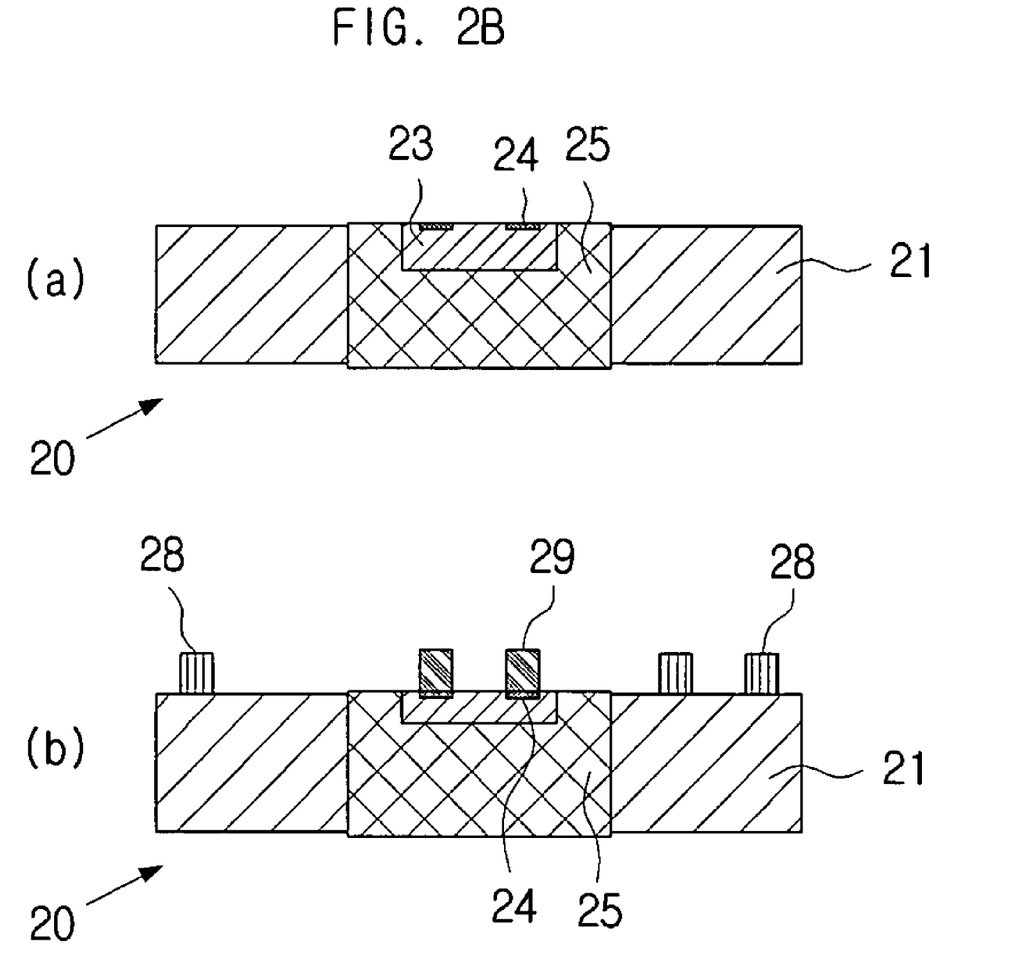
FIG. 2b is a fabrication diagram for a bare chip embedded PCB according to a first disclosed embodiment of the invention.

FIG. 2a is a flowchart of a method of manufacturing a PCB having an embedded bare chip according to a first disclosed embodiment of the invention, and FIG. 2b is a fabrication diagram for a bare chip embedded PCB according to the first disclosed embodiment of the invention. Referring to FIG. 2b, a board 21, electrode pads 24, a bare chip 23, a filler 25, a circuit pattern 28, and electrode bumps 29 are illustrated.

S11 of FIG. 2a is an operation of embedding a bare chip inside the board 21 such that the electrode pads 24 are exposed. This bare chip 23 may be inserted using a filler 25 as in (a) of FIG. 2b, or may also be inserted using adhesive after forming a groove by using a drill. It is important that the electrode pads 24 of the bare chip 23 be exposed at the surface of the board 21.

S12 of FIG. 2a is an operation of forming the electrode bumps on the surface of electrode pads. The electrode bumps 29 may generally be formed by plating, or by sputtering or other types of screen printing. A diffusion stopping layer may be formed on the surface of electrode pads 24 before forming the electrode bumps 24.

The circuit pattern 28 may be formed at the same time the electrode bumps 29 are formed, or may be formed in a different operation. Also, the circuit pattern 28 may be connected directly with the electrode bumps 29.

Figure 3A:
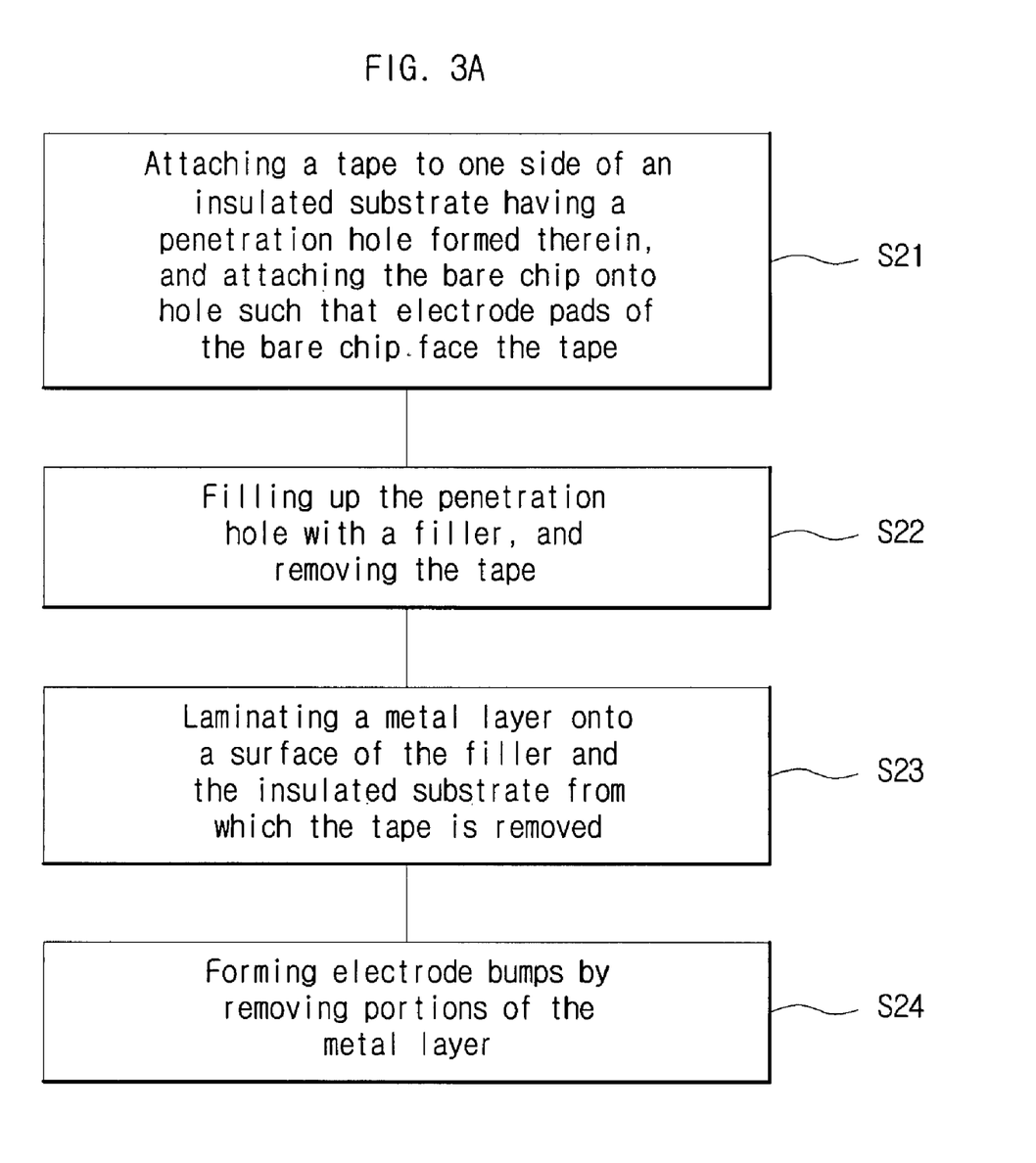
FIG. 3a is a flowchart of a method of a manufacturing a PCB having an embedded bare chip according to a second disclosed embodiment of the invention.
Figure 3B:
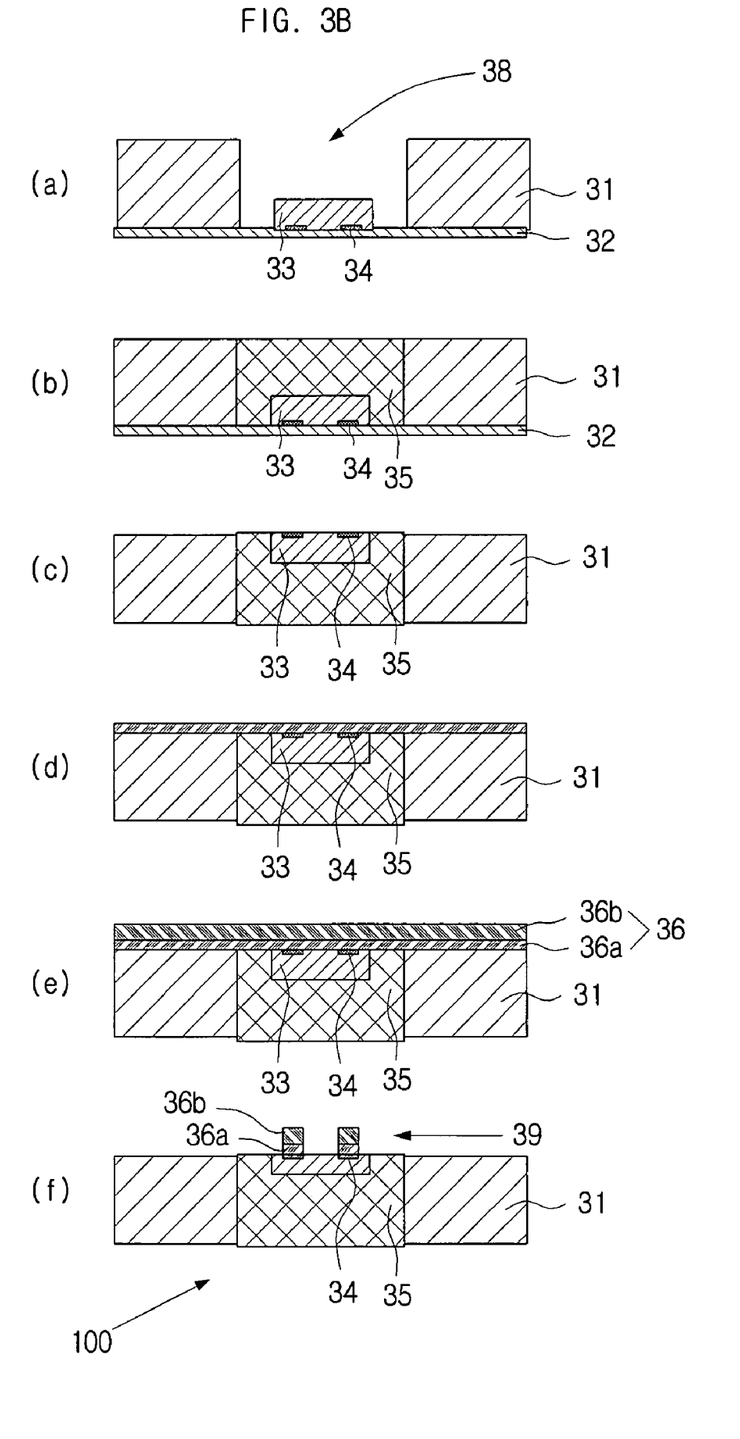
FIG. 3b is a conceptual diagram showing the manufacturing process of a PCB having an embedded bare chip according to a second disclosed embodiment of the invention.
Figure 4:
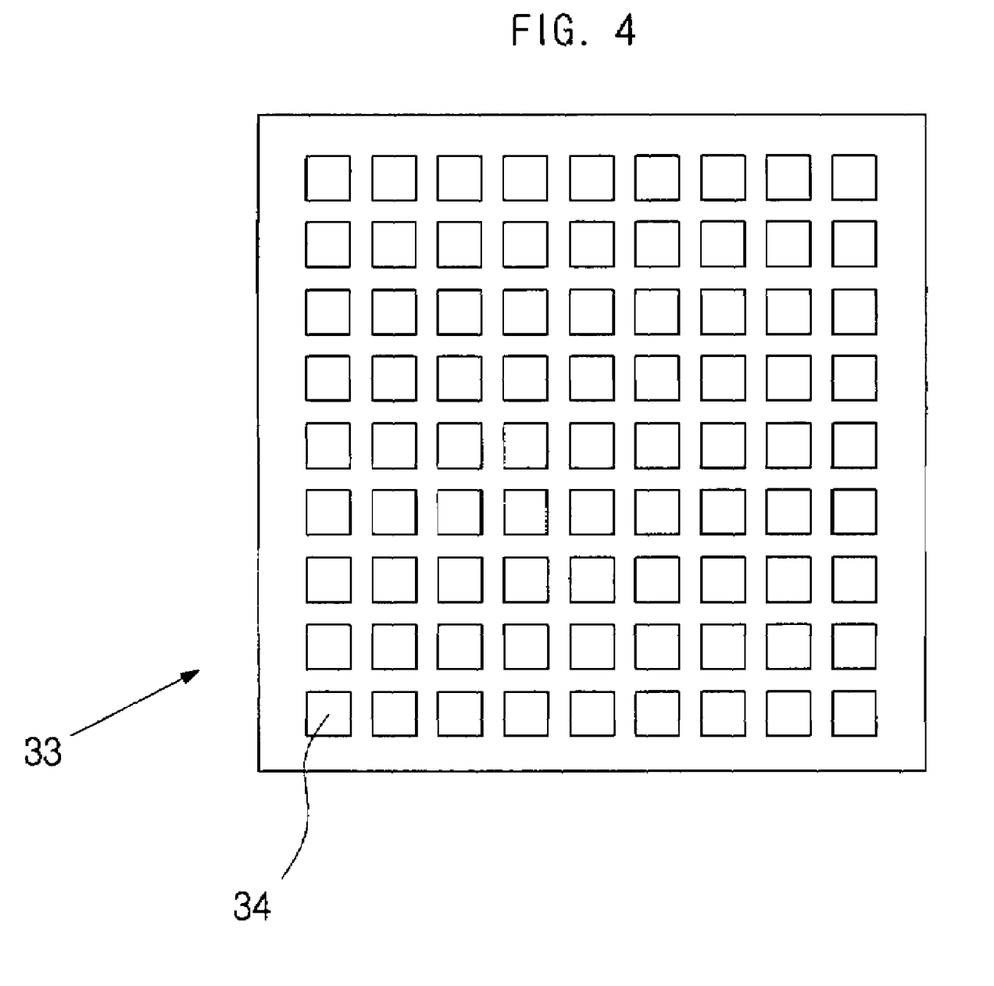
FIG. 4 is a bottom view of a bare chip according to a third disclosed embodiment of the invention.

FIG. 3a is a flowchart of a method of a manufacturing a PCB having an embedded bare chip according to a second disclosed embodiment of the invention, FIG. 3b is a conceptual diagram showing the manufacturing process of a PCB having an embedded bare chip according to the second disclosed embodiment of the invention, and FIG. 4 is a bottom view of a bare chip according to a third disclosed embodiment of the invention. Referring to FIGS. 3b and 4, an insulated substrate 31, tape 32, a bare chip 33, electrode pads 34, a filler 35, a metal layer 36, a diffusion stopping layer 36a, a thick film 36b, a penetration hole 38, electrode bumps 39, and a PCB 100 are illustrated.

S21 of FIG. 3a, corresponding to (a) of FIG. 3b, is an operation of attaching the tape 32 to one side of the insulated substrate 31, in which the penetration hole 38 is formed, and attaching the bare chip 33 to the tape 32 inside the penetration hole 38 in the direction of the electrode pads 34.

The insulated substrate 31 may be generally made of prepreg. Prepreg is a material generally made of resin and glass fiber, and is used as the insulator material for PCB's. Of course, other materials may be used as the insulated substrate 31, as long as it fulfills the function of insulation.

When this insulated substrate 31 is prepared, the penetration hole 38 is punched, in which the bare chip 33 will be inserted. Mechanical drilling is an example of a punching method. The penetration hole 38 may be wider than the bare chip 33, but it is not needed for the penetration hole 38 to be formed in an excessively wide size. The penetration hole 38 with an excessively wide size will require more of the filler 35 to fill up the empty space after the bare chip 33 is inserted, and may degrade the strength of the insulated substrate 31.

Next, the tape 32 is attached to the insulated substrate 31. The tape may have adhesion on at least one side. This is to readily adhere with the insulated substrate 31 and secure the bare chip 33 inside the penetration hole 38.

When the tape 32 is attached to one side of the insulated substrate 31, the bare chip 33 is inserted through the open side on the other side of the penetration hole 38 and adhesively secured to the tape 32. Here, it is important that the electrode pads 34 of the bare chip 33 face the tape 32. This is because the metal layer 36 will subsequently be formed on the upper surface of the electrode pads 34.

The bare chip 33 is a chip cut off from the wafer, just before undergoing packaging. As illustrated in FIG. 4, several electrode pads 34 are formed on one side of the bare chip 33 that will be connected to external electrodes.

S22 of FIG. 3a, corresponding to (b) and (c) of FIG. 3b, is an operation of filling in the filler 35 inside the penetration hole 38 and removing the tape 32.

When the bare chip 33 has been adhesively secured to the surface of the tape 32 in operation S21, the filler 35 is filled inside the penetration hole 38. While epoxy is generally used as the filler 35, any other material may be used that has insulating and adhesive properties.

The tape 32 is removed after the filler 35 has hardened. The electrode pads 34 of the bare chip 33 are exposed to the outside as shown in (c) of FIG. 3b when the tape 32 is removed.

S23 of the FIG. 3a, corresponding to (d), (e) of FIG. 3b, is an operation of forming the metal layer 36. The metal layer 36 is of a sufficient thickness to form the electrode bumps 39.

Therefore, the diffusion stopping layer 36a that will be a seed layer is formed by electroless plating or sputtering processes. The diffusion stopping layer 36a not only functions as the seed layer but also prevents diffusion between the thick film 36b plated on the diffusion stopping layer 36a and the electrode pads 34.

Generally, the electrode pas 34 may be made of aluminum, and the thick film 36b may be made of copper. Aluminum and copper have the property of being easily broken by stress when they are in direct contact with each other and diffusion occurs.

Therefore, it may be essential to have the diffusion stopping layer 36a described above. As to this diffusion stopping layer 36a, titanium may generally be used. However, any other material may be used that fulfills the same purpose.

It may be desirable to apply a dry process such as sputtering etc. for forming the diffusion stopping layer 36a with titanium, because it is difficult to obtain precipitation in a liquid state.

After this diffusion stopping layer (36a) is formed, the thick film (5 mm) is formed in a relatively short time by electro plating.

In (f) of FIG. 3b, corresponding to S24 of the FIG. 3a, electrode bumps 39 are formed, after the bare chip 33 is embedded in the insulated substrate 31 and the filler 35, by performing an etching process, such as a photolithography process, on the metal layer 36 including the diffusion stopping layer 36a and the thick film 36b. Thus, the PCB 100 is completed. Meanwhile, the circuit pattern may be formed concurrently with the etching.

While the manufacturing process of FIG. 3b described above is an operation using a subtractive method, the same results may be obtained using a semi-additive method. An embodiment of the invention using a semi additive method will be described below in more detail.

Figure 5:
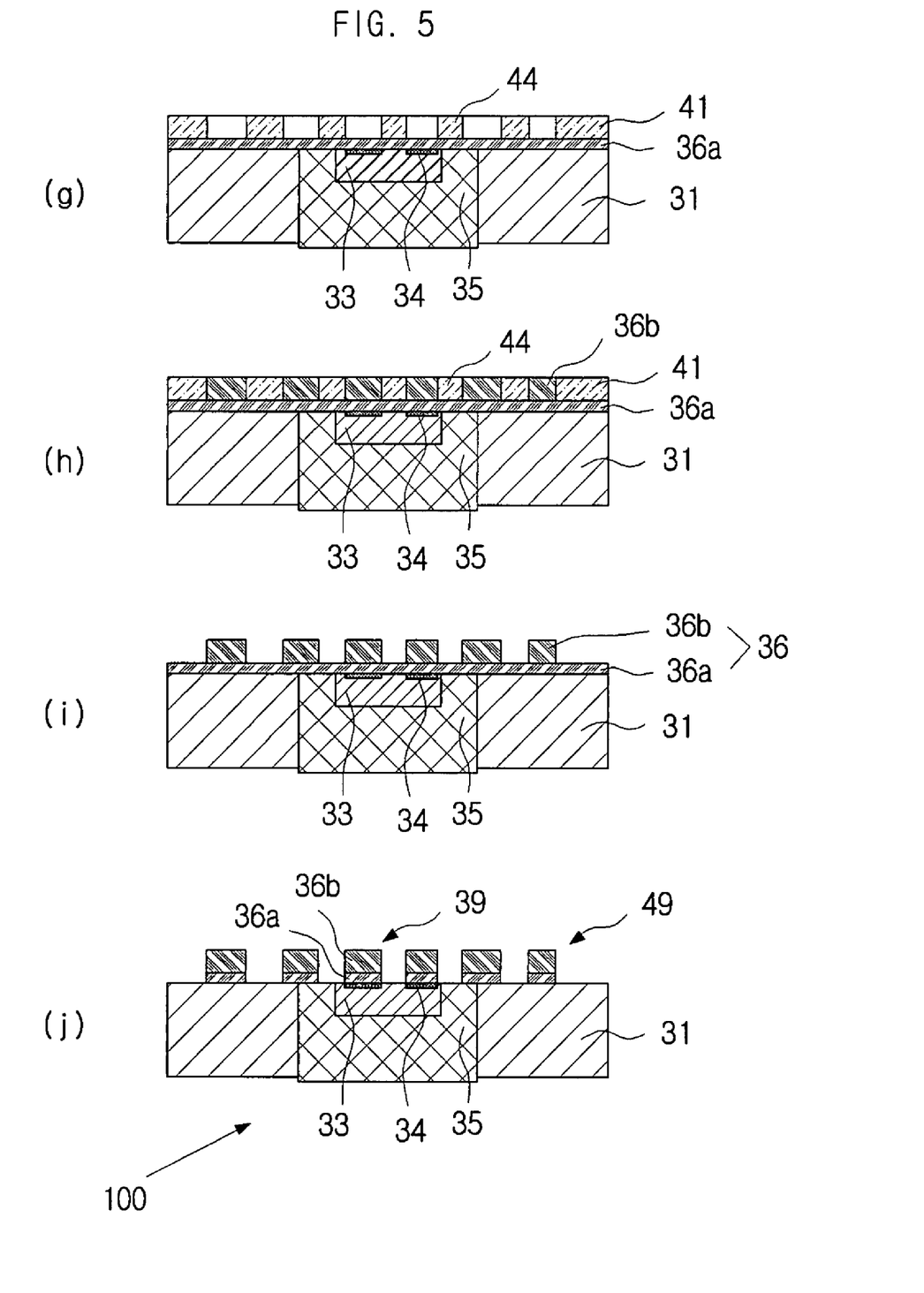
FIG. 5 is a conceptual diagram of a method of manufacturing a PCB having an embedded bare chip according to a fourth disclosed embodiment of the invention.

FIG. 5 is a conceptual diagram of a method of manufacturing a PCB having an embedded bare chip according to a fourth disclosed embodiment of the invention. Referring to FIG. 5, an insulated substrate 31, a bare chip 33, electrode pads 34, a filler 35, a diffusion stopping layer 36a, a thick film 36b, a metal layer 36, electrode bumps 39, a dry film 41, a pattern 44, a circuit pattern 49, and a PCB 100 are illustrated.

This embodiment omits the operations (a) through (d) of FIG. 5, as they are identical to the operations for the embodiment of FIG. 3b. The subsequent operations are as follows.

Drawing (g) of FIG. 5 shows the operations of attaching a photosensitive dry film 41 onto the upper side of the diffusion stopping layer 36a, and forming the pattern after the exposure and development processes. In the present embodiment, the parts where the circuit pattern 49 and the electrode bumps 39 will be formed are developed at the same time.

The diffusion stopping layer 36a is exposed in the developed parts. Since the diffusion stopping layer 36a is a metal layer, the thick film 36b is formed in (h) of FIG. 5 by electro plating.

The circuit pattern 49 is formed on the upper side of the insulated substrate 31 and the electrode bumps 39 are formed on the surface of electrode pads 34, when the diffusion stopping layer has been removed by etching after eliminating the dry film 41.

The subtractive method and the semi additive method described above are general processes for forming the circuit pattern. The electrode bumps of the bare chip are naturally formed during such processes, so that no other process is required for forming the electrode bumps.

A stacking process may be continued on the PCB 100 in (f) of FIG. 3b and (j) of FIG. 5, using RCC (resin coated copper) or prepreg. Moreover, a via hole may be formed by using a laser drill or a mechanical drill after the stacking process. The PCB having an embedded bare chip is completed after the insides of the via holes are plated for connecting the electrode bumps with the circuit pattern.

Figure 6:
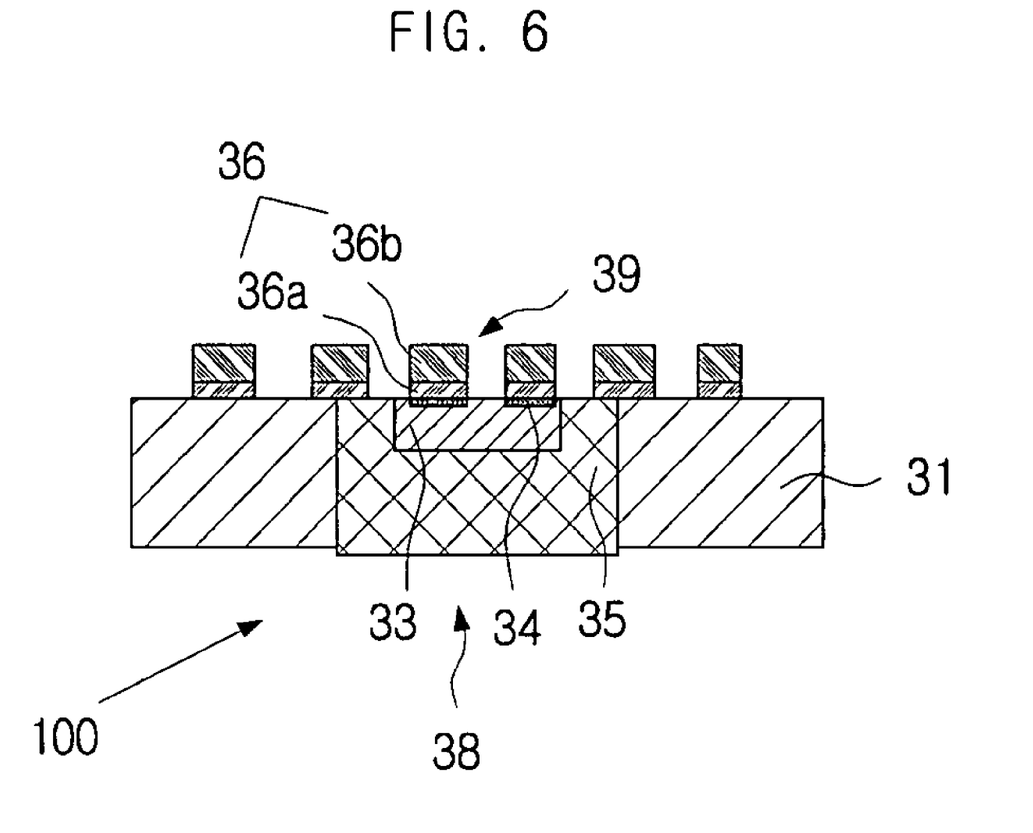
FIG. 6 is a cross-sectional view of a PCB having an embedded bare chip according to a fifth disclosed embodiment of the invention.

FIG. 6 is a cross-sectional view of a PCB having an embedded bare chip according to a fifth disclosed embodiment of the invention. Referring to FIG. 6, an insulated substrate 31, a bare chip 33, electrode pads 34, a filler 35, a metal layer 36, a diffusion stopping layer 36a, a thick film 36b, a penetration hole 38, electrode bumps 39, and a PCB 100 are illustrated.

The penetration hole 38 inside the insulated substrate 31 is filled with the filler 35. Prepreg may generally be used as the insulated substrate 31. The penetration hole 38 may be formed by a mechanical method. The inside of the penetration hole 38 is filled with the filler 35, where epoxy may be used as the material of the filler 35. It may be preferable that the filler 35 have both an insulating property and an adhesive property.

Meanwhile, the bare chip 33 is embedded in the filler 35. It may be preferable that the side of the bare chip 33 having the electro pads 34 be exposed at the surface of the filler 35. The electrode bumps 39 are formed on the upper side of the electrode pads 34. Consequently, the electrode bumps 39 are given a protruded shape from the surface of the PCB 100. Since the electrode pump 39 is protruded inside the insulated substrate, during the stacking process, this kind of shape makes it relatively easy to form via holes by a process such as laser drilling etc.

It may be desirable that the electrode bumps 39 be formed of two metal layers, where the electrode bumps 39 may include the diffusion stopping layer 36a in contact with the electrode pads 34 and the thick film 36b positioned on the diffusion stopping layer 36a. In particular, it may be desirable that the diffusion stopping layer 36a be made by a material such as titanium etc. Titanium may be positioned between the aluminum, typically used for the electrode pads 34, and the copper, typically used for the thick film 36b, to prevent diffusion.

The thick film 36b may generally be made by electro plating, as it has the advantage that the thick layer can be formed within a relatively short time. Generally, this thick film 36b is made of a copper layer. However, any other metal may be used if the same effects are obtained.

According to the present invention comprised as above, the re-wiring process, which had previously been applied in a bare chip state, can be performed in a general production line of a PCB. Therefore, the mass production system of a PCB having an embedded bare chip can be made to have a simplified process and low cost.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A printed circuit board (PCB) having an embedded bare chip, the PCB comprising:
    an insulated substrate having a penetration hole formed therein;
    a filler filling up an inside of the penetration hole;
    a bare chip embedded in the filler such that electrode pads formed on one side thereof are exposed at the surface of the filler, the electrode pads having approximately a same height as an upper surface of the bare chip or being slightly caved in relative to the upper surface of the bare chip;
    an electrode bump, a surface of the electrode bump being attached to a surface of one of the electrode pads, the electrode bump protruding so that surfaces of the electrode bump, other than the surface attached to the surface of one of the electrode pads, are exposed to the outside; and
    a circuit pattern formed on the insulated substrate,
    wherein the electrode bump is formed simultaneously with the circuit pattern in a plating process of forming the circuit pattern, and
    the circuit pattern is formed directly on the insulating substrate.

2. The PCB of claim 1, wherein the electrode bump comprises a diffusion stopping layer positioned at a surface of the electrode pad, and a thick film laminated on a surface of the diffusion stopping layer.

3. The PCB of claim 2, wherein the diffusion stopping layer comprises titanium.

4. The PCB of claim 1, wherein the surface of the electrode bump attached to the surface of one of the electrode pads is at approximately the same height as a surface of the circuit pattern attached to a surface of the insulated substrate.

* * * * *